(12) United States Patent
Kim

(10) Patent No.: US 8,124,998 B2
(45) Date of Patent: Feb. 28, 2012

(54) LIGHT EMITTING DEVICE PACKAGE

(75) Inventor: Hyung-kun Kim, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/225,090

(22) Filed: Sep. 14, 2005

(65) Prior Publication Data

US 2006/0118800 A1    Jun. 8, 2006

(30) Foreign Application Priority Data

Dec. 6, 2004 (KR) .......................... 10-2004-0101653

(51) Int. Cl.
*H01L 33/00* (2010.01)

(52) U.S. Cl. ............ 257/99; 257/98; 257/712; 257/762; 257/E33.058; 257/E33.066; 257/E33.075

(58) Field of Classification Search .................. None
See application file for complete search history.

(56) References Cited

U.S. PATENT DOCUMENTS

| 6,809,342 | B2 * | 10/2004 | Harada ........................ 257/79 |
| 2002/0070449 | A1 * | 6/2002 | Yagi et al. .................... 257/734 |
| 2002/0080463 | A1 * | 6/2002 | Tonar et al. .................. 359/267 |
| 2002/0139990 | A1 * | 10/2002 | Suehiro et al. ................ 257/99 |
| 2003/0160256 | A1 * | 8/2003 | Durocher et al. ............. 257/88 |
| 2003/0209714 | A1 * | 11/2003 | Taskar et al. .................. 257/79 |
| 2005/0110123 | A1 * | 5/2005 | Waitl et al. ................... 257/678 |
| 2005/0139846 | A1 * | 6/2005 | Park et al. ..................... 257/98 |
| 2006/0043401 | A1 * | 3/2006 | Lee et al. ...................... 257/99 |
| 2006/0183625 | A1 * | 8/2006 | Miyahara ...................... 501/98.4 |
| 2006/0198162 | A1 * | 9/2006 | Ishidu et al. .................. 362/623 |
| 2006/0220050 | A1 * | 10/2006 | Higaki et al. ................. 257/99 |
| 2006/0261364 | A1 * | 11/2006 | Suehiro et al. ............... 257/100 |
| 2007/0018181 | A1 * | 1/2007 | Steen et al. .................... 257/98 |

FOREIGN PATENT DOCUMENTS

| JP | 07-283441 | | 10/1995 |
| JP | 10-084175 | | 3/1998 |
| JP | 11-87780 | A | 3/1999 |
| JP | 2002-203989 | A | 7/2002 |
| JP | 2002-289923 | A | 10/2002 |
| JP | 2003-303999 | A | 10/2003 |
| JP | 2004-228387 | A | 8/2004 |
| JP | 2004-335740 | * | 11/2004 |
| JP | 2005-039100 | A | 2/2005 |
| JP | 2005-197329 | A | 7/2005 |
| WO | WO2004005216 | A1 * | 1/2004 |
| WO | 2004-082036 | A1 | 9/2004 |
| WO | WO2004082036 | A1 * | 9/2004 |
| WO | WO2005/020338 | * | 3/2005 |

OTHER PUBLICATIONS

Korean Office Action Application No. 10-2004-0101653 dated Apr. 23, 2008, and Translation thereof.

(Continued)

*Primary Examiner* — Hoang-Quan Ho
(74) *Attorney, Agent, or Firm* — Buchanan Ingersoll & Rooney PC

(57) ABSTRACT

A light emitting device package is provided. The light emitting device package includes: a light emitting device; and first and second electrodes disposed a predetermined distance from each other and respectively adhered to the light emitting device so as to be electrically connected to the light emitting device, the first and second electrodes applying a current or voltage to the light emitting device and emitting heat generated by the light emitting device.

20 Claims, 3 Drawing Sheets

OTHER PUBLICATIONS

Japanese Office Action issued on Apr. 5, 2011 in corresponding Japanese Patent Application No. 2005-339493 with English translation.

Office Action, with translation, dated Oct. 25, 2011, issued in corresponding Japanese Patent Application No. 2005-339493.

* cited by examiner

LIGHT EMITTING DEVICE PACKAGE

BACKGROUND OF THE INVENTION

This application claims the priority of Korean Patent Application No. 10-2004-0101653, filed on Dec. 6, 2004 in the Korean Intellectual Property Office, the disclosure of which is incorporated herein in its entirety by reference.

1. FIELD OF THE INVENTION

The present invention relates to a light emitting device package, and more particularly, to a miniaturized light emitting device package including electrodes that act as heat sinks.

2. DESCRIPTION OF THE RELATED ART

Wire bonding is commonly used to package light emitting devices such as light emitting diodes (LEDs) and laser diodes (LDs).

FIG. 1 is a cross section of a conventional light emitting device package manufactured using wire bonding. Referring to FIG. 1, a light emitting device 12 is adhered on the top of a heat sink 14 which emits heat generated by the light emitting device 12. The top surface of the light emitting device 12 is connected to an electrode 16 provided in a package housing 10 by a bonding wire 18 made of, for example, Au. However, miniaturization of the light emitting device package as described above is difficult due to the wire bonding process. Recently, a flip chip bonding, which directly connects a light emitting device to a submount, is gaining much attention. However, the wire bonding process is still in use.

SUMMARY OF THE INVENTION

The present invention provides an improved light emitting device package that can be miniaturized by including electrodes that act as heat sinks.

According to an aspect of the present invention, there is provided a light emitting device package including: a light emitting device; a submount adhered to the light emitting device and electrically connected to the light emitting device; first and second electrodes disposed a predetermined distance from each other and respectively adhered to the submount, the first and second electrodes applying a current or voltage to the light emitting device and emitting heat generated by the light emitting device; and bonding wires which electrically connect the submount to the first electrode, and the submount to the second electrode.

The light emitting device and the submount may be adhered by bonding metals or conductive adhesives. Here, the bonding metals may be solders, Au, or Cu.

The submount and the first electrode, and the submount and the second electrode may be respectively adhered by thermally conductive materials.

Reflective layers made of Ag or Al may be respectively coated on top surfaces of the first and second electrodes on which the submount is adhered.

According to another aspect of the present invention, there is provided a light emitting device package including: a light emitting device; a submount adhered to the light emitting device and electrically connected to the light emitting device; and first and second electrodes disposed at a predetermined distance from each other and respectively adhered to the submount to be electrically connected to the submount, the first and second electrodes applying a current or voltage to the light emitting device and emitting heat generated by the light emitting device.

Within at least a pair of first and second via holes respectively corresponding to the first and second electrodes that are formed in the submount, first and second packing materials made of an electrical conductive material with thermal conductivity may be disposed.

Here, the first and second packing materials may be made of a pure metal or an alloy.

According to another aspect of the present invention, there is provided a light emitting device package including: a light emitting device; and first and second electrodes disposed a predetermined distance from each other and respectively adhered to the light emitting device to be electrically connected to the light emitting device, the first and second electrodes applying a current or voltage to the light emitting device and emitting heat generated by the light emitting device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
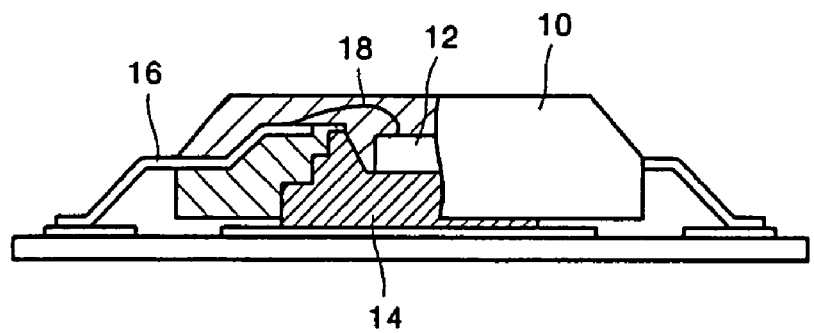
FIG. 1 is a cross section of a conventional light emitting device package manufactured using wire bonding.

The present invention will now be described more fully with reference to the accompanying drawings, in which exemplary embodiments of the invention are shown. Like reference numerals in the drawings denote like elements.

Figure 2:
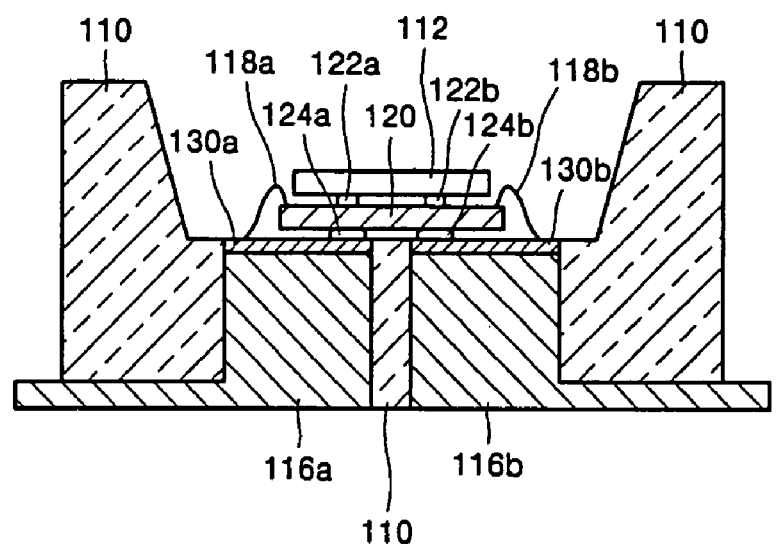
FIG. 2 is a schematic cross section of a light emitting device package according to a first embodiment of the present invention.

FIG. 2 is a schematic cross section of a light emitting device package according to a first embodiment of the present invention.

Referring to FIG. 2, the light emitting device package includes a light emitting device 112, a submount 120 disposed under the light emitting device 112, first and second electrodes 116a and 116b disposed under the submount 120, and bonding wires 118a and 118b which electrically connect the first and second electrodes 116a and 116b to the submount 120, respectively.

The light emitting device 112 may be a semiconductor device such as a light emitting diode (LED) or a laser diode (LD). The light emitting device 112 may emit light through its top.

The light emitting device 112 is adhered to the submount 120 through flip chip bonding. In more detail, electrodes (not shown) of the light emitting device 112 are electrically connected to the submount 120 by bonding materials 122a and 122b adhered to the submount 120, respectively. The bonding metals 122a and 122b may be solders made of a Au—Sn alloy or a Sn—Ag alloy, or metals such as Au or Cu. The light emitting device 112 may be adhered to the submount 120 by an electrically conductive adhesive.

The submount 120 is adhered to the first and second electrodes 116a and 116b. The first and second electrodes 116a and 116b are disposed at a predetermined distance from each other and apply a current or voltage to the light emitting device 112. At the same time, the first and second electrodes 116a and 116b also emit heat generated from the light emitting device 112. The first and second electrodes 116a and 116b may be adhered to the submount 120 by a heat conductive material 124a and 124b.

The first and second electrodes 116a and 116b are electrically connected to the submount 120 by the bonding wires 118a and 118b, respectively. The bonding wires 118a and 118b may be made of a material with high electric conductivity such as Au. Meanwhile, an interconnection layer (not shown) is patterned on the submount 120 so that the first and second electrodes 116a and 116b can be electrically connected to the light emitting device 112 through the bonding wires 118a and 118b, respectively.

Reflective layers 130a and 130b may be coated on the top surfaces of the first and second electrodes 116a and 116b where the submount 120 is adhered to reflect light generated from the light emitting device 112 towards above the light emitting device 112. The reflective layers 130a and 130b can be made of Ag or Al.

The first and second electrodes 116a and 16b are supported by a package housing 110. The package housing 110 may be made of a material stable at high temperatures or a heat-resistant insulating material such as a ceramic. The package housing 110 is also interposed between the first and second electrodes 116a and 116b to electrically insulate the first and second electrodes 116a and 116b from each other.

As such, in the present embodiment, the first and second electrodes 116a and 116b, which apply a current or voltage to the light emitting device 112, also perform the function of emitting heat generated by the light emitting device 112. Consequently, the light emitting device package can be miniaturized.

Figure 3:
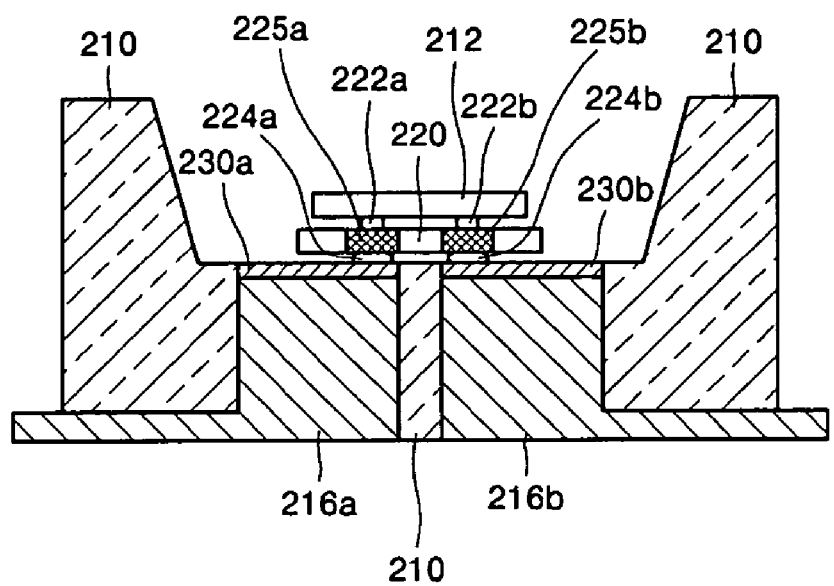
FIG. 3 is a schematic cross section of a light emitting device package according to a second embodiment of the present invention.
Figure 4:
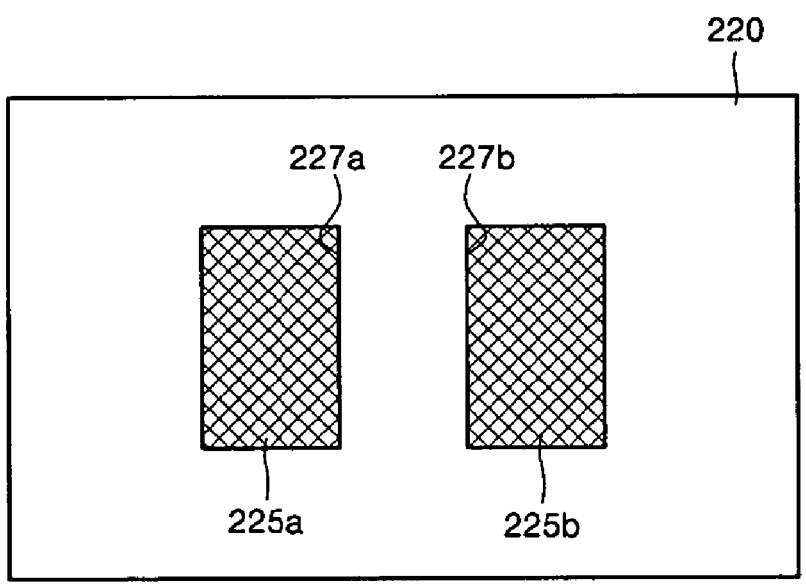
FIG. 4 is a plan view of a submount illustrated in FIG. 3.

FIG. 3 is a schematic cross section of a light emitting device package according to a second embodiment of the present invention, and FIG. 4 is a plan view of a submount 220 illustrated in FIG. 3.

Referring to FIGS. 3 and 4, the light emitting device package includes a light emitting device 212, the submount 220 disposed under the light emitting device 212, and first and second electrodes 216a and 216b disposed under the submount 220.

The light emitting device 212 may be a semiconductor device such as an LED or an LD. The light emitting device 212 is adhered to the submount 220 through flip chip bonding.

First and second via holes 227a and 227b are formed in the submount 220. The first and second via holes 227a and 227b correspond to the first and second electrodes 216a and 216b, respectively. First and second packing materials 225a and 225b composed of an electrical conductive material with high thermal conductivity fill the first and second via holes 227a and 227b. The first and second packing materials 225a and 225b may be a pure metal or an alloy.

Bonding metals 222a and 222b are respectively interposed between the first packing material 225a and the light emitting device 212, and between the second packing material 225b and the light emitting device 212 to electrically connect the light emitting device 212 to the submount 220. The bonding metals 222a and 222b may be solders made of a Au—Sn alloy or a Sn—Ag alloy, or metals such as Au or Cu. Conductive adhesives may be respectively interposed between the first packing material 225a and the light emitting device 212, and between the second packing material 225b and the light emitting device 212.

The submount 220 is adhered to the first and second electrodes 216a and 216b. The first and second electrodes 216a and 216b are disposed at a predetermined distance from each other and apply a current or voltage to the light emitting device 212 through the submount 220 while emitting heat generated by the light emitting device 212. To this end, bonding metals 224a and 224b are interposed between the first packing material 225a and the first electrode 216a, and between the second packing material 225b and the second electrode 216b, respectively. The bonding metals 224a and 224b may be solders made of a Au—Sn alloy or a Sn—Ag alloy, or metals such as Au or Cu. Meanwhile, conductive adhesives may be interposed between the first packing material 225a and the first electrode 216a, and between the second packing material 225b and the second electrode 216b. When the bonding materials on the top surface of the submount 220 and on the bottom surface of the submount 220 are made of the same material, the light emitting device 212, the submount 220, and the first and second electrodes 216a and 216b can be joined through a single process.

Reflective layers 230a and 230b can be coated on the top surfaces of the first and second electrodes 216a and 216b on which the submount 220 is adhered to reflect the light generated by the light emitting device 212 towards above the light emitting device 212. The reflective layers 230a and 230b can be made of Ag or Al.

The first and second electrodes 216a and 216b are supported by a package housing 210. The package housing 210 may be made of a material stable at high temperatures or a heat-resistant insulating material such as a ceramic. The package housing 210 is also interposed between the first and second electrodes 216a and 216b to electrically insulate the first and second electrodes 216a and 216b from each other.

The wire bonding process used in the previous embodiment is not required in the present embodiment since the via holes 227a and 227b are formed on the submount 220 and the first and second packing materials 225a and 225 are disposed inside the via holes 227a and 227b. Consequently, the light emitting device package can be manufactured through a simplified process.

Figure 5:
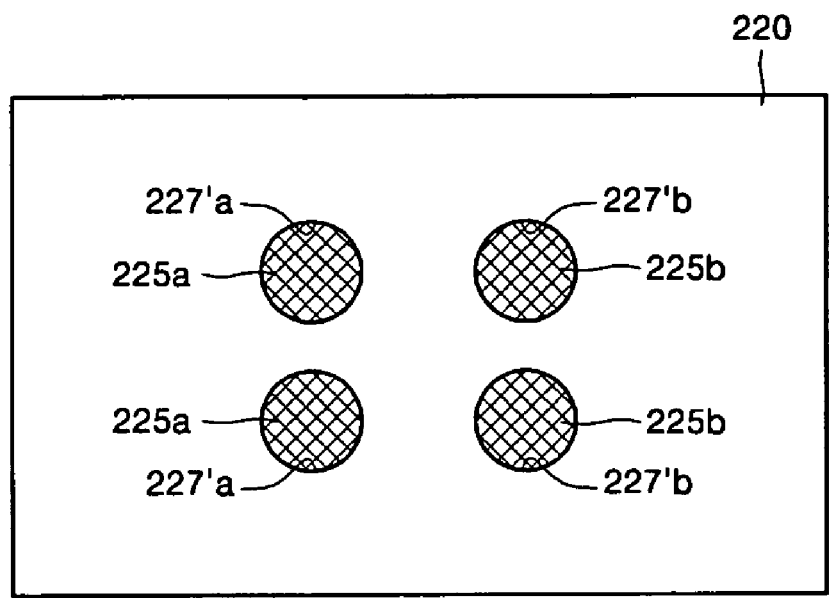
FIG. 5 is a plan view of a modification of the submount illustrated in FIG. 3.

Although the first and second via holes 227a and 227b are illustrated in FIG. 4 as having rectangular cross sections, embodiments of the present invention are not limited to this configuration. The number of via holes and the shapes of the cross sections of the via holes can be altered in numerous ways. For example, a plurality of first and second via holes 227'a and 227'b, each having a circular cross section, can be formed on the submount 220 as illustrated in FIG. 5. First and second packing materials 225'a and 225'b made of an electrical conductive material with high thermal conductivity can be disposed inside the first and second via holes 227'a and 227'b.

Figure 6:
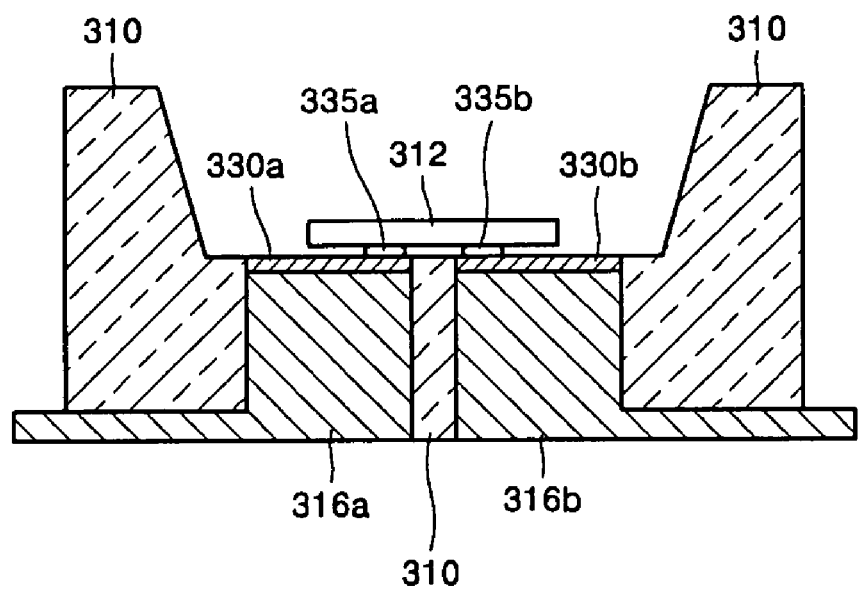
FIG. 6 is a schematic cross section of a light emitting device package according to a third embodiment of the present invention.

FIG. 6 is a schematic cross section of a light emitting device package according to a third embodiment of the present invention.

Referring to FIG. 6, the light emitting device package includes a light emitting device 312, and first and second electrodes 316a and 316b to which the light emitting device 312 is adhered which are disposed under the light emitting device 312.

The light emitting device 312 may be a semiconductor device such as an LED or an LD. The light emitting device 312 is adhered to the first and second electrodes 316a and 316b through flip chip bonding.

The first and second electrodes 316a and 316b are disposed at a predetermined distance from each other and apply a current or voltage to the light emitting device 312 while emitting heat generated by the light emitting device 312. To this end, bonding metals 335a and 335b are interposed between the light emitting device 312 and the first electrode 316a, and between the light emitting device 312 and the second electrode 316b, respectively. The bonding metals 335a and 335b may be solders made of a Au—Sn alloy or a Sn—Ag alloy, or metals such as Au or Cu. Meanwhile, the light emitting device 312 may be adhered to the first and second electrodes 316a and 316b by a conductive adhesive.

Reflective layers 330a and 330b can be coated on the top surfaces of the first and second electrodes 316a and 316b on which the light emitting device 312 is adhered to reflect the light generated by the light emitting device 312 above the light emitting device 312. The reflective layers 330a and 330b can be made of Ag or Al.

The first and second electrodes 316a and 316b are supported by a package housing 310. The package housing 310 may be made of a material stable at high temperatures or a heat-resistant insulating material such as a ceramic. The package housing 310 is also interposed between the first and second electrodes 316a and 316b to electrically insulate the first and second electrodes 316a and 316b from each other.

As such, a submount such as the submounts 120 and 220 in the previous first and second embodiments is not included in the present embodiment, and the light emitting device 312 is directly adhered to the first and second electrodes 316a and 316b. Thus, the light emitting device package can be manufactured in accordance with a simplified process, and can be further miniaturized.

As described above, the size of a light emitting device package can be reduced and the process of manufacturing the light emitting device package can be simplified by including two electrodes which apply a voltage to a light emitting device while emitting heat generated from the light emitting device. Also, the size of the light emitting device package can be further reduced when the light emitting device is directly adhered to the two electrodes.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light emitting device package comprising:
   a light emitting device;
   a submount adhered to the light emitting device and electrically connected to the light emitting device;
   first and second electrodes disposed a predetermined distance from each other and respectively adhered to the submount to be electrically connected to the submount;
   a package housing disposed below the submount and interposed between the first and second electrodes to electrically insulate the first and second electrodes from each other; and
   reflective layers respectively coated on top surfaces of the first and second electrodes on which the submount is adhered,
   wherein the package housing is made of a heat-resistant insulating material, and the package housing further supports the first and second electrodes on an outer side of the first and second electrodes opposed to an inner side of the first and second electrodes disposed the predetermined distance from each other,
   wherein the first and second electrodes are configured for applying a current or voltage to the light emitting device, and dissipating heat generated by the light emitting device in a direction below the light emitting device, and having a vertical structure formed through the package housing to have a determined cross-sectional area in a formation direction, and
   wherein each of the first and second electrodes has a first portion overlapping the light emitting device and a second portion not overlapping the submount, the first and second portions formed across substantially an entire thickness direction of the package housing.

2. The light emitting device package of claim 1, wherein the light emitting device and the submount are adhered by bonding metals.

3. The light emitting device package of claim 2, wherein the bonding metals are solders.

4. The light emitting device package of claim 2, wherein the bonding metals are Au or Cu.

5. The light emitting device package of claim 1, wherein the submount and the first and second electrodes are respectively adhered by thermally conductive materials.

6. The light emitting device package of claim 1, wherein the reflective layers are made of Ag or Al.

7. The light emitting device package of claim 1, further comprising first and second bonding wires which electrically connect the submount to the first and second electrodes, respectively.

8. The light emitting device package of claim 1, wherein the light emitting device and the submount are adhered by at least one conductive adhesive.

9. The light emitting device package of claim 1, wherein at least one pair of first and second via holes respectively corresponding to the first and second electrodes are formed in the submount, and first and second packing materials made of an electrical conductive material with thermal conductivity are disposed inside the first and second via holes.

10. The light emitting device package of claim 9, wherein the first and second packing materials are made of a pure metal or an alloy.

11. The light emitting device package of claim 9, wherein a bonding metal or conductive adhesive is interposed between the light emitting device and the first and second packing materials, respectively.

12. The light emitting device package of claim 9, wherein a bonding metal or conductive adhesive is interposed between the first packing material and the first electrode, and a bonding metal or conductive adhesive is interposed between the second packing material and the second electrode.

13. A light emitting device package comprising:
    a light emitting device;
    first and second electrodes disposed a predetermined distance from each other and are to be electrically connected to the light emitting device;
    a submount adhered to the light emitting device to be electrically connected to the light emitting device, and respectively adhered to the first and second electrodes to be electrically connected to the first and second electrodes;
    a package housing disposed below the submount and across the predetermined distance to electrically insulate the first and second electrodes from each other; and
    first and second reflective layers respectively coated on top surfaces of the first and second electrodes, the first and second reflective layers being operable to reflect light generated by the light emitting device back towards the light emitting device, wherein the package housing includes a first portion interposed between the first and second electrodes across the predetermined distance to electrically insulate the first and second electrodes from each other, and a second portion separated from the first portion by the first and second electrodes and extending away from the first portion to support the first and second electrodes, wherein the first and second electrodes are configured for applying a current or voltage to the light emitting device, and dissipating heat generated by the light emitting device in a direction below the light emitting device, and having a vertical structure formed through the package housing to have a determined cross-sectional area in a formation direction, and wherein each of the first and second electrodes has a first portion overlapping the light emitting device and a second portion not overlapping the light emitting device, the first and second portions formed across substantially an entire thickness direction of the package housing.

14. The light emitting device package of claim 13, wherein at least one pair of first and second via holes respectively corresponding to the first and second electrodes are formed in the submount, and first and second packing materials made of an electrical conductive material with thermal conductivity are disposed inside the first and second via holes.

15. The light emitting device package of claim 14, wherein the first and second packing materials are made of a pure metal or an alloy.

16. The light emitting device package of claim 14, wherein a bonding metal or conductive adhesive is interposed between the light emitting device and the first and second packing materials, respectively.

17. The light emitting device package of claim 14, wherein a bonding metal or conductive adhesive is interposed between the first packing material and the first electrode, and a bonding metal or conductive adhesives is interposed between the second packing material and the second electrode.

18. The light emitting device package of claim 13, wherein the light emitting device and the first and second electrodes are respectively adhered by bonding metals.

19. The light emitting device package of claim 13, wherein the light emitting device and the first and second electrodes are respectively adhered by conductive adhesives.

20. The light emitting device package of claim 13, wherein the light emitting device is directly adhered to the first and second electrodes.

* * * * *